US009411232B2

(12) United States Patent
Nagahara et al.

(10) Patent No.: US 9,411,232 B2
(45) Date of Patent: Aug. 9, 2016

(54) COMPOSITION FOR FORMING FINE RESIST PATTERN, AND PATTERN FORMATION METHOD USING SAME

(71) Applicant: AZ ELECTRONIC MATERIALS (LUXEMBOURG) S.A.R.L., Somerville, NJ (US)

(72) Inventors: Tatsuro Nagahara, Shizuoka (JP); Takashi Sekito, Shizuoka (JP); Kazuma Yamamoto, Shizuoka (JP); Masakazu Kobayashi, Shizuoka (JP); Noboru Satake, Shizuoka (JP); Masahiro Ishii, Shizuoka (JP)

(73) Assignee: AZ ELECTRONIC MATERIALS (LUXEMBOURG) S.A.R.L., Luxembourg (LU)

( * ) Notice: Subject to any disclaimer, the term of this patent is extended or adjusted under 35 U.S.C. 154(b) by 0 days.

(21) Appl. No.: 14/770,694

(22) PCT Filed: Mar. 14, 2014

(86) PCT No.: PCT/JP2014/056983
§ 371 (c)(1),
(2) Date: Aug. 26, 2015

(87) PCT Pub. No.: WO2014/136991
PCT Pub. Date: Sep. 12, 2014

(65) Prior Publication Data
US 2016/0011508 A1 Jan. 14, 2016

(30) Foreign Application Priority Data

Mar. 5, 2013 (JP) ................. 2013-043177

(51) Int. Cl.
*G03F 7/11* (2006.01)
*G03F 7/40* (2006.01)
*G03F 7/09* (2006.01)
*H01L 21/027* (2006.01)
*H01L 21/768* (2006.01)
*C08L 33/14* (2006.01)
*C09D 139/04* (2006.01)
*G03F 7/039* (2006.01)
*G03F 7/16* (2006.01)
*G03F 7/20* (2006.01)
*G03F 7/32* (2006.01)

(52) U.S. Cl.
CPC . *G03F 7/11* (2013.01); *C08L 33/14* (2013.01); *C09D 139/04* (2013.01); *G03F 7/039* (2013.01); *G03F 7/0392* (2013.01); *G03F 7/094* (2013.01); *G03F 7/16* (2013.01); *G03F 7/168* (2013.01); *G03F 7/20* (2013.01); *G03F 7/32* (2013.01); *G03F 7/40* (2013.01); *G03F 7/405* (2013.01); *H01L 21/0274* (2013.01); *H01L 21/76816* (2013.01)

(58) Field of Classification Search
CPC ............. G03F 7/11; G03F 7/40; G03F 7/094; G03F 7/38; G03F 7/168; H01L 21/0273; H01L 21/0274; H01L 21/0275; H01L 21/312; H01L 21/76816; C08L 33/14; C09D 139/00; C09D 139/02; C09D 139/04
USPC ........... 430/270.1, 271.1, 322, 325, 329, 330, 430/331, 324, 269, 394, 906, 964; 438/725, 438/780, 700, 702, 760; 525/374, 379; 427/97.1, 97.2, 97.6
See application file for complete search history.

(56) References Cited

U.S. PATENT DOCUMENTS

| | | | | |
|---|---|---|---|---|
| 6,579,657 B1 * | 6/2003 | Ishibashi | ............... | G03F 7/0035 257/E21.024 |
| 7,592,132 B2 * | 9/2009 | Takahashi | ............. | G03F 7/0035 430/270.1 |
| 7,595,141 B2 * | 9/2009 | Kudo | ......... | G03F 7/40 430/270.1 |
| 7,745,093 B2 | 6/2010 | Nishibe et al. | | |
| 7,923,200 B2 * | 4/2011 | Thiyagarajan | ............ | G03F 7/40 430/14 |
| 8,101,333 B2 * | 1/2012 | Noya | ......... | G03F 7/40 430/270.1 |
| 8,148,052 B2 * | 4/2012 | Vanleenhove | ........ | G03F 7/0035 430/311 |
| 8,329,384 B2 * | 12/2012 | Watanabe | ............. | G03F 7/0035 430/270.1 |
| 2005/0284502 A1 * | 12/2005 | Watanabe | ............... | G03F 7/322 134/2 |
| 2006/0088788 A1 | 4/2006 | Kudo et al. | | |
| 2007/0048659 A1 * | 3/2007 | Namiki | ..................... | G03F 7/40 430/270.1 |
| 2009/0317739 A1 | 12/2009 | Thiyagarajan et al. | | |
| 2014/0127478 A1 * | 5/2014 | Okamura | .............. | C08F 226/02 428/195.1 |

FOREIGN PATENT DOCUMENTS

| | | |
|---|---|---|
| JP | 10-73927 A | 3/1998 |
| JP | 2003-84459 A | 3/2003 |
| JP | 2005-300853 A | 10/2005 |
| JP | 2007-57967 A | 3/2007 |
| JP | 2008-518260 A | 5/2008 |
| JP | 2010-250118 A | 11/2010 |
| JP | 2011-524930 A | 9/2011 |
| JP | 2013-20211 A | 1/2013 |

* cited by examiner

*Primary Examiner* — Amanda C Walke
(74) *Attorney, Agent, or Firm* — Mitchell Brustein

(57) ABSTRACT

The present invention provides a composition enabling to form a fine negative photoresist pattern less suffering from surface roughness, and also provides a pattern formation method employing that composition. The composition is used for miniaturizing a resist pattern by fattening in a process of forming a positive resist pattern from a chemically amplified positive-working type resist composition, and it contains a polymer comprising a repeating unit having an amino group, a solvent, and an acid. In the pattern formation method, the composition is cast on a positive photoresist pattern beforehand obtained by development and is then heated to form a fine pattern.

16 Claims, No Drawings

COMPOSITION FOR FORMING FINE RESIST PATTERN, AND PATTERN FORMATION METHOD USING SAME

This application is a United States National Stage Patent Application under 35 U.S.C. §371 of International Patent Application No. PCT/JP2014/056983, filed Mar. 14, 2014, which claims priority to Japanese Patent Application No. 2013-043177, filed Mar. 5, 2013, the contents of which are being hereby incorporated herein by reference.

TECHNICAL FIELD

The present invention relates to a composition for obtaining a fine resist pattern miniaturized by fattening or thickening a beforehand formed resist pattern in a production process of semiconductor devices and the like, and this invention also relates to a pattern formation method employing that composition.

BACKGROUND ART

In manufacturing semiconductor devices, resist patterns have been required to be made minute enough to meet increased integration density and highly accelerated processing speed in LSIs. Resist patterns are normally formed in photo-lithographic processes from, for example, positive-working type resists, whose solubilities to alkali developers are increased by exposure to light. Accordingly, the resists in the areas exposed to light are removed with the alkali developers to form positive resist patterns. However, the fineness of the resultant patterns greatly depends on the exposure methods and light sources, and hence in order to stably produce fine resist patterns, a huge investment is necessary to install special and expensive facilities and equipments needed for the exposure methods and light sources capable of ensuring the fineness.

In view of that, there are various techniques studied for further miniaturizing resist patterns formed beforehand by conventional methods. For example, they include a practical method in which a resist pattern stably produced by a conventional method is coated with a composition comprising a water-soluble resin and optional additives so as to fatten or thicken the resist pattern and thereby to decrease the diameter of holes and/or the width of furrow lines separating the ridges in the pattern.

Specifically, the following processes and composition are known:

(1) a process comprising the steps of
coating a conventionally formed resist pattern with a composition crosslinkable by an acid,
heating the resist pattern to diffuse the acid contained in the resist so that the composition on the resist may be crosslinked to form a crosslinked layer at the interface therebetween as a covering layer of the resist pattern, and
removing the uncrosslinked composition with a developer to fatten or thicken the resist pattern and thereby to decrease the diameter of holes and/or the width of furrow lines separating the ridges in the pattern (see, Patent documents 1 and 2);

(2) a process comprising the steps of
coating a conventionally formed resist pattern with an aqueous solution of a copolymer derived from (meth)acrylic acid monomers and water-soluble vinyl monomers, and
heating the resist pattern to shrink and thereby to become finer (see, Patent document 3); and (3) a water-soluble coating composition which comprises a polymer containing amino groups, in particular, primary amines and which is used for covering a photoresist pattern (see, Patent document 4).

However, the present inventors have found that, if the basic resin-containing composition described in Patent document 4 is adopted to miniaturize a pattern, the resultant pattern is often insufficiently miniaturized and further it sometimes has many defects on the surface.

PRIOR ART DOCUMENTS

Patent Documents

[Patent document 1] Japanese Patent Laid-Open No. 10(1998)-73927
[Patent document 2] Japanese Patent Laid-Open No. 2005-300853
[Patent document 3] Japanese Patent Laid-Open No. 2003-84459
[Patent document 4] Japanese Patent Laid-Open No. 2008-518260

DISCLOSURE OF INVENTION

Problem to be Solved by the Invention

In view of the above problem, it is an object of the present invention to provide a composition which can achieve large effect of miniaturizing a positive pattern formed from chemically amplified positive-working type resist and, at the same time, which can reduce generation of defects on the surface thereof. Further, it is another object of the present invention to provide a pattern formation method employing that composition.

Means for Solving Problem

The present invention resides in a fine pattern-forming composition used for miniaturizing a resist pattern by fattening in a process of forming a positive resist pattern from a chemically amplified positive-working type resist composition,
containing
a polymer comprising a repeating unit having an amino group,
a solvent, and
an acid.

The present invention also resides in a method for forming a positive resist pattern, comprising the steps of
coating a semiconductor substrate with a chemically amplified photoresist composition, to form a photoresist layer;
exposing to light said semiconductor substrate coated with said photoresist layer;
developing said photoresist layer with a developer after said exposing step, to form a photoresist pattern;
coating said photoresist pattern with a fine pattern-forming composition containing a polymer comprising a repeating unit having an amino group, a solvent, and an acid;
heating the coated photoresist pattern, and
washing to remove excess of the fine pattern-forming composition.

Effect of the Invention

The present invention enables to stably obtain a sufficiently miniaturized positive photoresist pattern having few defects on the surface.

BEST MODE FOR CARRYING OUT THE INVENTION

Embodiments according to the present invention are described below in detail.

Fine Pattern-Forming Composition

The fine pattern-forming composition (hereinafter, often simply referred to as "composition") of the present invention contains a polymer comprising a repeating unit having an amino group, a solvent, and an acid. Thus, the polymer used in the present invention has an amino group. Here, the "amino group" means a primary amino group (—$NH_2$), a secondary amino group (—NHR) or a tertiary amino group (—NRR'). Further, in the present specification, the term "amino group" includes a group, such as —N=, in which a nitrogen atom connects to an adjacent atom via a double bond. The amino group may be positioned either at the main chain of the polymer or at the side chain of the repeating unit.

There are various known polymers comprising repeating units having the above amino groups. Examples of the polymers comprising repeating units having primary amino groups at the side chains include polyvinylamine, polyallylamine, polydiallylamine, and poly(allylamine-co-diallylamine).

Examples of the polymers having the amino groups at the main chains include polyalkyleneimines such as polyethyleneimine and polypropyleneimine. It is also possible to adopt a polymer having an amido bond —NH—C(=O)— in the main chain.

Further, as the polymer in the composition of the present invention, it is still also possible to adopt a polymer having a structure in which a nitrogen atom connects to an adjacent atom via a double bond on one side and also connects to another adjacent atom via a single bond on the other side. This structure may be included either in the side chain or in the main chain of the polymer. However, the structure is typically included in the side chain as a part of a heterocyclic ring. Examples of the heterocyclic ring having that structure include imidazole ring, oxazole ring, pyridine ring, and bipyridine ring.

The polymer used in the present invention can be properly selected from the above in view of availability and the kind of the resist pattern. Among the above, polyvinylamine, polyvinylimidazole and polyvinylpyrrolidone are preferred because they give favorable effects on coatability and on reduction of the pattern.

As the polymer contained in the composition of the present invention, it is yet also possible to adopt a copolymer comprising repeating units having no amino groups in such an amount as not to impair the effect of the present invention. For example, the copolymer may comprise copolymerized units of polyacrylic acid, polymethacrylic acid or polyvinyl alcohol.

However, if the polymer comprises too many repeating units having no amino groups, the affinity between the polymer and the resin in the photoresist cannot be kept enough to obtain the effect of the present invention. In view of that, the amount of the repeating units having no amino groups is preferably 50 mol % or less, more preferably 30 mol % or less, based on the total repeating units of the polymer.

In the present invention, there are no particular restrictions on the molecular weight of the polymer having the amino group, but the weight average molecular weight thereof is generally 5000 to 200000, preferably 8000 to 150000. Here, the "weight average molecular weight" means a polystyrene-reduced weight average molecular weight measured by gel permeation chromatography.

The polymer comprising a repeating unit having the amino group has good affinity with a photoresist and hence tends to soak easily thereinto. On the other hand, however, in the miniaturizing process, the polymer may dissolve partly de-protected portions of the photoresist at the interface between the composition coat and the resist pattern, and consequently the pattern is often insufficiently miniaturized. In view of that, it is desired to treat the pattern while protecting the surface of the photoresist so as to obtain sufficient miniaturizing effect. This desired treatment is achieved in the present invention by incorporating an acidic substance into the composition.

Specifically, a normal high-resolution positive-working type photoresist composition generally contains a combination of a photo acid-generating agent and an alkali-soluble resin having terminal groups protected with protective groups. When a layer of that composition is exposed to radiation such as UV-light, electron beams or X-rays, the photo acid-generating agent in the exposed area releases an acid, which eliminates the protective groups from the alkali-soluble resin (hereinafter, this elimination is referred to as "de-protection").

The thus de-protected alkali-soluble resin is soluble in an alkali developer (e.g., aqueous solution of tetramethylammonium) and hence can be removed by development.

However, the development cannot completely remove the de-protected alkali-soluble resin, and there remains partly de-protected resin on the photoresist pattern surface.

The polymer comprising a repeating unit having the amino group tends to soak easily into the resist, but often dissolves the partly de-protected photoresist on the surface. As a result, in the rinse treatment performed after development in the miniaturizing process, that photoresist elutes into a rinse solution at the interface between the resist pattern and the composition, so that the aimed miniaturizing effect often fails to be obtained and/or that pattern roughness is caused.

In order to avoid the above problem, it is conceivable to adopt a composition that does not dissolve the partly de-protected resin on the resist pattern surface. For the purpose of having that property, the composition of the present invention contains an acid.

There are no particular restrictions on the acid usable in the present invention unless it gives unfavorable effects to the resist pattern. The acid can be selected from inorganic or organic acids. Examples of the organic acids include: carboxylic acids, such as acetic acid, propionic acid, butyric acid, benzoic acid, phthalic acid, glutamic acid, citric acid, fumaric acid, methoxyacetic acid, glycolic acid, and glutaric acid; and sulfonic acids, such as methanesulfonic acid, ethanesulfonic acid, 2-aminoethanesulfonic acid, trifluoromethanesulfonic acid, benzenesulfonic acid, p-toluenesulfonic acid, pentafluoropropionic acid, and 10-camphorsulfonic acid. Among them, p-toluenesulfonic acid, trifluoromethanesulfonic acid, and pentafluoropropionic acid are particularly preferred because they are highly soluble in water and have such high boiling points that they hardly volatilize from the coat when heated in the production process. Examples of the inorganic acids include sulfuric acid, nitric acid, hydrochloric acid, and phosphoric acid. Among them, sulfuric acid and nitric acid are preferred because they hardly introduce elements largely affecting electric properties and hence have excellent affinity with semiconductor processing.

In addition, the composition according to the present invention further contains a solvent. Any solvent can be used without restrictions unless it dissolves the resist pattern, but water is preferred. The water preferably purified by distillation, ion-exchange treatment, filtration, various kinds of adsorption treatment or the like to remove organic impurities, metal ions and the like. It is particularly preferred to use pure water. For the purpose of improving wettability, a small amount of organic solvent may be incorporated as a co-solvent. Examples of the organic solvent include: alcohols such as methyl alcohol, ethyl alcohol, and propyleneglycol monomethyl ether; ketones such as acetone and methyl ethyl ketone; and esters such as ethyl lactate and ethyl acetate. The solvent should be so selected that it may not dissolve or denature the resist layer on which the composition is intended to be applied.

As described above, the fine pattern-forming composition of the present invention comprises a solvent and a polymer having a particular structure. The content of the polymer is freely selected according to the size and kind of the resist pattern and also to the aimed pattern fineness. However, the polymer having a particular structure is contained in an amount of generally 0.1 to 10 wt %, preferably 1.0 to 7.0 wt % based on the total weight of the composition.

The composition contains the acid in an amount of preferably 0.5 to 50 wt %, more preferably 2.5 to 30 wt. % based on the total weight of the polymer having the amino group.

The fine pattern-forming composition generally has a pH value of preferably 2 to 11 inclusive, more preferably 3 to 10 inclusive. If the pH value is less than 2 or more than 11, the composition often dissolves the photoresist pattern to roughen the surface thereof. It is hence preferred to adjust the pH value properly.

Further, the fine pattern-forming composition of the present invention can contain other additives, if necessary. Examples of the additives include surfactants, germicides, antibacterial agents, antiseptic agents and anti-mold agents. Among them, in view of the coatability, the composition preferably contains a surfactant. The additives give no essential effects to the performance of the composition, and the amount thereof is normally 1% or less, preferably 0.1% or less, further preferably 0.05% or less, based on the total weight of the composition. However, it is possible to improve the coatability without using the surfactants if the surface of the resist pattern is pretreated before the fine pattern-forming composition is cast thereon.

Pattern Formation Method

The following is an explanation of the method according to the present invention for forming a fine resist pattern. The pattern formation method described below is a typical one using the fine pattern-forming composition of the present invention.

First, a chemically amplified photoresist is cast on a surface, which may be pretreated if necessary, of a substrate, such as a silicon substrate, according to a known coating method such as spin-coating method, to form a chemically amplified photoresist layer. Prior to casting the photoresist, an antireflective coat may be beforehand formed on the substrate surface. The antireflective coat can improve the section shape and the exposure margin.

Any known chemically amplified photoresist can be used in the pattern formation method of the present invention. The chemically amplified photoresist generates an acid when exposed to radiation such as UV light, and the acid serves as a catalyst to promote chemical reaction by which solubility to an alkali developer is increased within the areas irradiated with the radiation to form a pattern. For example, the chemically amplified photoresist comprises an acid-generating compound, which generates an acid when exposed to radiation, and an acid-sensitive functional group-containing resin, which decomposes in the presence of acid to form an alkali-soluble group such as phenolic hydroxyl or carboxyl group. The photoresist may comprise an alkali-soluble resin, a crosslinking agent and an acid-generating compound.

According to necessity, the chemically amplified photoresist layer formed on the substrate is prebaked, for example, on a hot plate to remove solvent contained in the photoresist, to form a photoresist film normally having a thickness of about 50 to 500 nm. The prebaking temperature depends on the solvent and the photoresist, but is normally about 50 to 200° C., preferably about 70 to 150° C.

The photoresist film is then subjected to exposure through a mask, if necessary, by means of known exposure apparatus such as a high-pressure mercury lamp, a metal halide lamp, an ultra-high pressure mercury lamp, a KrF excimer laser, an ArF excimer laser, a soft X-ray irradiation system, and an electron beam lithography system.

After the exposure, baking treatment may be carried out, if necessary, and then development such as paddle development is carried out to form a resist pattern. In the present invention, the resist is developed with an alkali developer, which can be freely selected from known alkali developers such as aqueous solutions of tetramethylammonium hydroxide and potassium hydroxide.

After the development, the resist pattern is preferably rinsed (washed) with a rinse solution, which is preferably pure water.

Subsequently, the obtained resist pattern is miniaturized by applying the fine pattern-forming composition of the present invention. However, prior to applying the composition, the resist pattern may be subjected to surface treatment by applying water or an organic solvent not dissolving the pattern. This surface treatment improves the coatability of the composition, so that the composition can be spread evenly. This means that the coatability can be improved without adding additives for improving the coatability, such as surfactants, into the composition. This treatment is often referred to as "pre-wet treatment".

Thereafter, the fine pattern-forming composition of the present invention is cast so as to cover the whole resist pattern, and consequently the resist pattern is fatten or thicken by the interaction between the resist pattern and the composition. This interaction is presumed to be such impregnation of the polymer into the resist and/or such adhesion of the polymer onto the resist as fattens or thickens the resist pattern.

Specifically, the fine pattern-forming composition of the present invention soaks into and/or attaches onto the inner walls of grooves or holes in the resist pattern, to fatten or thicken the pattern. As a result, the composition narrows the width of furrow lines separating the ridges in the pattern, and thereby enables to essentially miniaturize the pitch size and hole opening size of the resist pattern more than the resolution limit.

In the pattern formation method of the present invention, the fine pattern-forming composition can be cast according to any of the coating methods conventionally adopted for casting photoresist resin compositions. For example, spin coating method can be used.

If necessary, the resist pattern coated with the fine pattern-forming composition can be heated by prebaking. The prebaking may be carried out while the temperature is either kept constant or elevated step-by-step. After coated with the fine pattern-forming composition, the resist pattern is heated at, for example, 40 to 200° C., preferably 80 to 180° C., for 10 to 300 seconds, preferably 30 to 120 seconds. This heating procedure is for the purpose of helping the polymer to soak into and/or attach onto the resist.

As a result of casting and heating the fine pattern-forming composition, the resist pattern is so fattened as to increase the width of the ridge lines in the pattern and to decrease the diameter of the hole pattern. Those dimension changes can be adequately controlled by selecting the conditions such as the temperature and time of heating, the kind of the photoresist resin composition and the like. Accordingly, the conditions are determined according to how far the resist pattern must be miniaturized, namely, how much the width of the ridge lines in the resist pattern must be broadened and/or how much the diameter of the hole pattern must be reduced. However, each dimension change in the resist pattern normally ranges from 5 to 30 nm in difference between before and after application of the fine pattern-forming composition.

After the resist pattern is essentially miniaturized, the fine pattern-forming composition unreacted with the resist, namely, excess of the composition can be rinsed away with water or solvents, if necessary. The water or solvents for rinsing must have poor ability to dissolve the fine pattern-forming composition soaked into or attached onto the resist pattern but must have high ability to dissolve the extra composition, which is neither soaked into nor attached onto the resist pattern. It is preferred to use a solvent contained in the fine pattern-forming composition, and it is particularly preferred to use pure water for rinsing.

In the way described above, the resist pattern immediately after developed undergoes dimension change by the action of the fine pattern-forming composition, and is thereby essentially miniaturized. The resist pattern thus produced by use of the fine pattern-forming composition according to the present invention is advantageously used in producing semiconductor devices or the like having finer patterns.

Examples

Resist Pattern Formation

An 8-inch silicon wafer was spin-coated with a bottom antireflective coat-forming composition (AZ ArF-1C5D [trademark], manufactured by AZ Electronic Materials (Japan) K.K.) by means of a spin coater (manufactured by Tokyo Electron Ltd.), and then baked at 200° C. for 60 seconds to form an antireflective coat of 37 nm thickness. Subsequently, a photosensitive resin composition (AZ AX2110P [trademark], manufactured by AZ Electronic Materials (Japan) K.K.) was cast thereon and baked at 110° C. for 60 seconds to form a resist layer of 120 nm thickness. The obtained wafer was subjected to first pattern exposure through a mask (line/space=1/1) by means of an ArF-beam (193 nm) exposure apparatus (manufactured by Nikon Corporation). Thereafter, the mask was turned 90 degrees and placed perpendicularly to the direction in the first pattern exposure, and then the wafer was subjected to second pattern exposure. After baked at 110° C. for 60 seconds, the wafer was then subjected to development for 30 seconds by use of an aqueous solution of tetramethylammonium hydroxide (2.38%) as a developer, to obtain a resist pattern having a pitch size of 160 nm and a hole size of 80 nm.

Preparation of Fine Pattern-Forming Compositions

A polyallylamine having a polystyrene-reduced weight average molecular weight of 25000 was prepared as the polymer used in the fine pattern-forming composition. The polymer was dissolved in pure water to obtain 2 wt % aqueous solution thereof. Into the solution, polyoxyethylene nonylphenyl ether (represented by the following formula (1)) was added as a surfactant in an amount of 500 ppm, to produce a composition A.

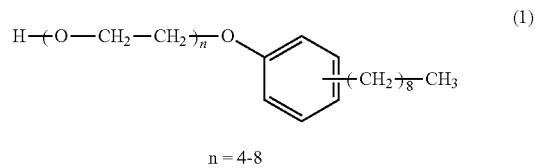

Independently, an allylamine/dimethylallylamine co-polymer having a polystyrene-reduced weight average molecular weight of 30000 was prepared as the polymer used in the fine pattern-forming composition. The polymer was dissolved in pure water to obtain 2 wt % aqueous solution thereof. Into the solution, acetylene-based diol polyoxyalkylene ether (represented by the following formula (2)) was added as a surfactant in an amount of 500 ppm, to produce a composition B.

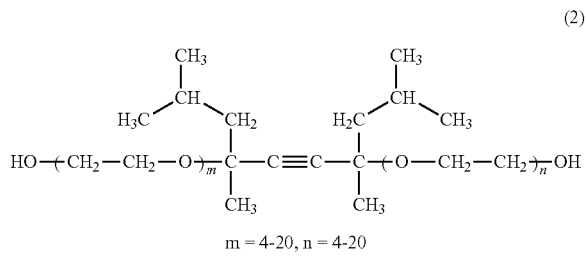

Further, a polyvinylimidazole having a poly-styrene-reduced weight average molecular weight of 70000 was prepared as the polymer used in the fine pattern-forming composition. The polymer was dissolved in pure water to obtain 2 wt % aqueous solution thereof. Into the solution, polyoxyethylene-lauryl amine (represented by the following formula (3)) was added as a surfactant in an amount of 500 ppm, to produce a composition C.

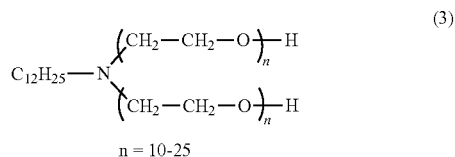

Furthermore, a polyethylene oxide/polyvinyl-imidazode block co-polymer (50 mol %:50 mol %) having a polystyrene-reduced weight average molecular weight of 15000 was prepared as the polymer used in the fine pattern-forming composition. The polymer was dissolved in pure water to obtain 2 wt % aqueous solution thereof. Into the solution, polyoxyethylene-monostearate (represented by the following formula (4)) was added as a surfactant in an amount of 300 ppm, to produce a composition D.

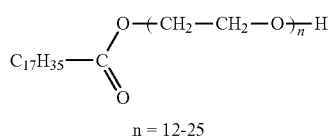

(4)

$n = 12\text{-}25$

Moreover, a polyvinylpyrrolidone having a poly-styrene-reduced weight average molecular weight of 67000 was prepared as the polymer used in the fine pattern-forming composition. The polymer was dissolved in pure water to obtain 2 wt % aqueous solution thereof. Into the solution, dimethyl-lauryl-amine oxide (represented by the following formula (5)) was added as a surfactant in an amount of 700 ppm, to produce a composition E.

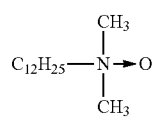

(5)

The acids shown in the following tables were individually added into each of the above compositions in an amount of 5 wt %, 20 wt % or 45 wt %, to obtain samples. Each sample was then cast on the beforehand prepared resist pattern by means of a spin coater (manufactured by Tokyo Electron Ltd.). In each example, the resist layer had a thickness of 100 nm, which was measured at a flat area of the resist layer. The resist pattern coated with the composition was heated at 140° C. for 1 minute, and subsequently excess of the composition was removed with pure water. The thus treated pattern surface was dried, and then defects formed thereon were observed by means of defect inspection system. In addition, it was evaluated how much the composition miniaturized the pattern. The results were shown in Tables 1a to 1d and 2a to 2d. For the purpose of evaluating the defects, the obtained pattern surface was classified into the following grades:

a: extremely excellent, b: of practically no problem though some defects were observed, and c: too defective to use.

TABLE 1a

| | Comparative examples (containing no acid) |
|---|---|
| Composition A | c |
| Composition B | c |
| Composition C | c |
| Composition D | c |
| Composition E | c |

TABLE 1b

| | Examples (containing 5 wt % of acid) | | | |
|---|---|---|---|---|
| | PFPS | sulfuric acid | TFMS | PTS |
| Composition A | b | b | b | a |
| Composition B | b | b | b | a |
| Composition C | b | b | b | b |
| Composition D | b | b | b | b |
| Composition E | b | b | b | b |

TABLE 1c

| | Examples (containing 20 wt % of acid) | | | |
|---|---|---|---|---|
| | PFPS | sulfuric acid | TFMS | PTS |
| Composition A | a | a | a | a |
| Composition B | a | a | a | a |
| Composition C | a | b | b | a |
| Composition D | a | b | b | a |
| Composition E | b | b | b | a |

TABLE 1d

| | Examples (containing 45 wt % of acid) | | | |
|---|---|---|---|---|
| | PFPS | sulfuric acid | TFMS | PTS |
| Composition A | a | a | a | a |
| Composition B | a | a | a | a |
| Composition C | a | a | a | a |
| Composition D | a | a | a | a |
| Composition E | a | a | a | a |

TABLE 2a

| | Comparative examples (containing no acid) |
|---|---|
| Composition A | 15 |
| Composition B | 15 |
| Composition C | 14 |
| Composition D | 16 |
| Composition E | 13 | in terms of: nm

TABLE 2b

| | Examples (containing 5 wt % of acid) | | | |
|---|---|---|---|---|
| | PFPS | sulfuric acid | TFMS | PTS |
| Composition A | 15 | 15 | 14 | 15 |
| Composition B | 14 | 16 | 14 | 14 |
| Composition C | 15 | 14 | 13 | 14 |
| Composition D | 14 | 16 | 15 | 16 |
| Composition E | 14 | 13 | 13 | 14 | in terms of: nm

TABLE 2c

| | Examples (containing 20 wt % of acid) | | | |
|---|---|---|---|---|
| | PFPS | sulfuric acid | TFMS | PTS |
| Composition A | 15 | 14 | 14 | 15 |
| Composition B | 13 | 15 | 13 | 13 |
| Composition C | 12 | 15 | 14 | 13 |
| Composition D | 15 | 14 | 13 | 13 |
| Composition E | 12 | 13 | 12 | 12 | in terms of: nm

TABLE 2d

| | Examples (containing 45 wt % of acid) | | | |
|---|---|---|---|---|
| | PFPS | sulfuric acid | TFMS | PTS |
| Composition A | 13 | 13 | 12 | 13 |
| Composition B | 12 | 14 | 13 | 12 |

TABLE 2d-continued

| | Examples (containing 45 wt % of acid) | | | |
|---|---|---|---|---|
| | PFPS | sulfuric acid | TFMS | PTS |
| Composition C | 14 | 13 | 12 | 13 |
| Composition D | 13 | 15 | 11 | 11 |
| Composition E | 12 | 11 | 11 | 12 | in terms of: nm

PFPS: pentafluoropropionic acid
PTS: p-toluenesulfonic acid
TFMS: trifluoromethanesulfonic acid As shown in Tables, the patterns treated with the compositions containing acids were remarkably improved in surface defects, as compared with those treated with the compositions containing no acids. On the other hand, the compositions containing acids were slightly inferior in the miniaturizing effect to those containing no acids, but the inferiority thereof was practically negligible. Accordingly, it was verified that the composition of the present invention reduces generation of defects without impairing other properties.

The invention claimed is:

1. A fine pattern-forming composition used for miniaturizing a resist pattern by fattening in a process of forming a positive resist pattern from a chemically amplified positive-working type resist composition,
    consisting essentially of
    a polymer comprising a repeating unit having an amino group, wherein said amino group is a primary amino group or a secondary amino group,
    a solvent,
    an acid selected from the group consisting of sulfonic acid, carboxylic acid, sulfuric acid, nitric acid, and mixtures thereof, wherein said acid is present in an amount from 2.5 to 30 weight % based on the total weight of said polymer, and
    an optional component selected from the group consisting of a surfactant, a germicide, an antibacterial agent, an antiseptic agent, an anti-mold agent and mixtures thereof.

2. The composition according to claim 1, wherein said repeating unit is one selected from the group consisting of allylamine unit, diallylamine unit, and ethyleneimine unit.

3. The composition according to claim 2, which has a pH value in the range of 2 to 11 inclusive.

4. The composition according to claim 1, wherein said polymer is one selected from the group consisting of polyvinylamine, polyallylamine, polydiallylamine, polyethyleneimine, and poly(allylamine-co-diallylamine).

5. The composition according to claim 4, which has a pH value in the range of 2 to 11 inclusive.

6. The composition according to claim 1, wherein said acid is a sulfonic acid selected from the group consisting of methanesulfonic acid, ethanesulfonic acid, 2-aminomethanesulfonic acid, trifluoromethanesulfonic acid, p-toluenesulfonic acid, and 10-camphorsulfonic acid.

7. The composition according to claim 6, which has a pH value in the range of 2 to 11 inclusive.

8. The composition according to claim 6, wherein the acid is selected from the group consisting of pentafluoropropionic acid, sulfuric acid, trifluoromethanesulfonic acid, p-toluenesulfonic acid and mixtures thereof.

9. The composition according to claim 1, wherein said acid is a carboxylic acid selected from the group consisting of acetic acid, methoxyacetic acid, glycolic acid, glutaric acid, and malic acid.

10. The composition according to claim 1, which has a pH value in the range of 2 to 11 inclusive.

11. The composition according to claim 1, wherein said solvent contains water.

12. The composition according to claim 1, which further contains a surfactant.

13. The composition according to claim 1, wherein the optional component selected from the group consisting of a surfactant, a germicide, an antibacterial agent, an antiseptic agent, an anti-mold agent and mixtures thereof is present in an amount of 1% or less based on the total weight of the composition.

14. A method for forming a positive resist pattern, comprising the steps of
    coating a semiconductor substrate with a chemically amplified photoresist composition, to form a photoresist layer;
    exposing to light said semiconductor substrate coated with said photoresist layer;
    developing said photoresist layer with a developer after said exposing step, to form a photoresist pattern;
    coating said photoresist pattern with a fine pattern-forming composition consisting essentially of a polymer comprising a repeating unit having an amino group, wherein said amino group is a primary amino group or a secondary amino group, a solvent, an acid selected from the group consisting of sulfonic acid, carboxylic acid, sulfuric acid, nitric acid, and mixtures thereof, wherein said acid is present in an amount from 2.5 to 30 weight % based on the total weight of said polymer, and an optional component selected from the group consisting of a surfactant, a germicide, an antibacterial agent, an antiseptic agent, an anti-mold agent and mixtures thereof;
    heating the coated photoresist pattern, and
    washing to remove excess of the fine pattern-forming composition.

15. The method according to claim 14 for forming a positive resist pattern, wherein said photoresist composition further contains a photo acid-generating agent.

16. A method for manufacturing semiconductors, comprising the steps of
    coating a semiconductor substrate with a chemically amplified photoresist composition, to form a photoresist layer;
    exposing to light said semiconductor substrate coated with said photoresist layer;
    developing said photoresist layer with a developer after said exposing step, to form a photoresist pattern;
    coating said photoresist pattern with a fine pattern-forming composition consisting essentially of a polymer comprising a repeating unit having an amino group, wherein said amino group is a primary amino group or a secondary amino group, a solvent, an acid selected from the group consisting of sulfonic acid, carboxylic acid, sulfuric acid, nitric acid, and mixtures thereof, wherein said acid is present in an amount from 2.5 to 30 weight % based on the total weight of said polymer, and an optional component selected from the group consisting of a surfactant, a germicide, an antibacterial agent, an antiseptic agent, an anti-mold agent and mixtures thereof;
    heating the coated photoresist pattern, and
    washing to remove excess of the fine pattern-forming composition.

* * * * *